United States Patent
Naito et al.

(10) Patent No.: US 7,417,316 B2
(45) Date of Patent: Aug. 26, 2008

(54) WIRED CIRCUIT FORMING BOARD, WIRED CIRCUIT BOARD, AND THIN METAL LAYER FORMING METHOD

(75) Inventors: Toshiki Naito, Osaka (JP); Hiroshi Yamazaki, Osaka (JP)

(73) Assignee: Nitto Denko Corporation, Osaka (JP)

( * ) Notice: Subject to any disclaimer, the term of this patent is extended or adjusted under 35 U.S.C. 154(b) by 393 days.

(21) Appl. No.: 11/147,345

(22) Filed: Jun. 8, 2005

(65) Prior Publication Data

US 2005/0280153 A1 Dec. 22, 2005

(30) Foreign Application Priority Data

Jun. 17, 2004 (JP) .............................. 2004-180245

(51) Int. Cl.
*H01L 23/48* (2006.01)
*H01L 23/52* (2006.01)
*H01L 29/40* (2006.01)

(52) U.S. Cl. ........................ 257/750; 257/753

(58) Field of Classification Search .......... 257/750–766
See application file for complete search history.

(56) References Cited

U.S. PATENT DOCUMENTS

| | | | |
|---|---|---|---|
| 3,881,884 A | 5/1975 | Cook et al. | |
| 4,917,963 A | 4/1990 | Kittler | |
| 5,874,174 A | 2/1999 | Okuda et al. | |
| 6,328,858 B1 | 12/2001 | Felsenthal et al. | |
| 6,838,314 B2 * | 1/2005 | Chang | 438/106 |

FOREIGN PATENT DOCUMENTS

| | | |
|---|---|---|
| DE | 1 097 234 | 1/1961 |
| GB | 1115911 | 6/1968 |
| JP | 03-082188 | 4/1991 |
| JP | 4-235272 | 8/1992 |
| JP | 6-212410 | 8/1994 |
| JP | 11-92579 | 4/1999 |
| JP | 11-158613 | 6/1999 |
| JP | 2001-73133 A | 3/2001 |
| JP | 2003-318533 | 11/2003 |

\* cited by examiner

*Primary Examiner*—Cuong Q Nguyen
(74) *Attorney, Agent, or Firm*—Jean C. Edwards, Esq.; Akerman Senterfitt

(57) ABSTRACT

A wired circuit forming board that can provide improved adhesion between an insulating layer and a conductive pattern and can also prevent delamination in a thin metal layer, a wired circuit board for which the same wired circuit forming board is used, and a thin metal layer forming method for forming the thin metal layer. The thin metal layer 2 is formed on the insulating base layer 1 by sputtering the first metal 35 and the second metal 36 in such a condition that a first metal diffusing region 37 for the first metal 35 to be diffused and a second metal diffusing region 38 for the second metal 36 to be diffused are overlapped with each other. This can allow formation of (i) a first unevenly-distributed metal portion 4 in which the first metal 35 is unevenly distributed and which is adjacent to the insulating base layer 1, (ii) a second unevenly-distributed metal portion 5 in which the second metal 36 is unevenly distributed and which is adjacent to the conductive pattern 6, and (iii) a metal coexisting portion 3 which is interposed between the first unevenly-distributed metal portion 4 and the second unevenly-distributed metal portion 5 and in which the first metal 35 and the second metal 36 are coexistent with each other in such a relation as to be continuously present in the thin metal layer 2 without defining any boundaries therebetween.

6 Claims, 4 Drawing Sheets

WIRED CIRCUIT FORMING BOARD, WIRED CIRCUIT BOARD, AND THIN METAL LAYER FORMING METHOD

BACKGROUND OF THE INVENTION

1. Field of the Invention

The present invention relates to a wired circuit forming board, to a wired circuit board, and to a thin metal layer forming method. More particularly, the present invention relates to a wired circuit forming board having a thin metal layer on an insulating layer, to a wired circuit board for which the wired circuit forming board is used, and to a thin metal layer forming method for forming the thin metal layer.

2. Description of the Prior Art

In recent years, in the field of the wired circuit board, density growth of the conductive pattern is demanded increasingly. In general, a subtractive process and an additive process are known as a patterning process of the conductive pattern. From the viewpoint of advantage of the additive process over the subtractive process in density growth, the additive process is widely used.

In the additive process, a thin metal layer is formed on an insulating layer of a resin film, such as a polyimide film, by sputtering and the like and, then, a conductive pattern is formed on the thin metal layer by electrolytic copper plating.

In this additive process, it is known that for the purpose of providing improved adhesion between the insulating layer and the conductive pattern, a thin nickel layer having good adhesion with the insulating layer is formed on the insulating layer by sputtering, first, and, then, a thin copper layer having good adhesion with the thin nickel layer and the conductive pattern is formed on the thin nickel layer by sputtering.

Also, there is proposed a flexible printed wired circuit board wherein for example a metallized layer is formed on either a single side or both sides of a plastic film and a conductive metal layer laminated on the metallized layer by electroplating, the metallized layer comprising a layer consisting primarily of Ni and Cr and a layer consisting primarily of copper, and wherein composition in an area (interface area A) in the vicinity of an interface of the layer consisting primarily of Ni and Cr on the side thereof contacting with the plastic film and composition in an area (interface area B) in the vicinity of an interface of the layer consisting primarily of Ni and Cr on the side thereof contacting with the layer consisting primarily of copper are different from each other, and the Cr content in the interface area A is higher than the Cr content in the interface area B (Cf. JP Laid-open (Unexamined) Patent Publication No. 2003-318533, for example).

This JP Laid-open (Unexamined) Patent Publication No. 2003-318533 describes that this invention can produce a flexible printed wired board, such as an FPC board and a COF board, having good adhesion to prevent peel and delamination even after subjected to several processes of e.g. pattern forming, etching, wiring, and IC-mounting and then subjected further to severe environmental tests.

However, when the thin nickel layer and the thin copper layer are formed in sequence by sputtering, an interface is produced between the thin nickel layer and the thin copper layer. Likewise, in the invention of this publication (JP Laid-open (Unexamined) Patent Publication No. 2003-318533 cited above), the interface is produced between the layer consisting primarily of Ni and Cr and the layer consisting primarily of copper.

When this interface is produced between those two layers, the adhesion between those layers is reduced in the interface area in the subsequent process of, for example, plating the conductive pattern. Thus, even when the adhesion between the insulating layer and the conductive pattern is in good condition, delamination is generated in the thin metal layer due to the presence of the interface, causing the delamination of the conductive pattern.

SUMMARY OF THE INVENTION

It is an object of the present invention to provide a wired circuit forming board that can provide improved adhesion between the insulating layer and the conductive pattern and can also prevent the delamination in the thin metal layer. It is another object of the present invention to provide a wired circuit board for which the same wired circuit forming board is used. It is still another object of the present invention to provide a thin metal layer forming method for forming the thin metal layer.

The present invention provides a wired circuit forming board comprising an insulating layer, and a thin metal layer formed on the insulating layer, wherein the thin metal layer comprises at least two kinds of metals and is formed to prevent a formation of an interface between the metals of different kinds in the thickness direction of the thin metal layer by the presence of a metal coexisting portion where the metals of different kinds are coexistent with each other.

In the wired circuit forming board of the present invention, it is preferable that the metal coexisting portion exists in a thickness direction of the thin metal layer in the proportion of 50% or more.

In the wired circuit forming board of the present invention, it is preferable that the thin metal layer comprises a first metal and a second metal, and has a high existence ratio of the first metal to the second metal on one thicknesswise side thereof adjacent to the insulating layer and a high existence ratio of the second metal to the first metal on the other thicknesswise side thereof not adjacent to the insulating layer, and wherein the metal coexisting portion exists at least partway along the thickness direction of the thin metal layer.

In the wired circuit forming board of the present invention, it is preferable that the second metal is copper, and the first metal is chromium or alloy thereof.

In the wired circuit forming board of the present invention, it is preferable that the thin metal layer is formed by sputtering the first metal and the second metal sequentially on a surface of the insulating layer, and the metal coexisting portion is formed by a first metal diffusing region for the first metal to be diffused on the surface of the insulating layer due to the sputtering and a second metal diffusing region for the second metal to be diffused on the surface of the insulating layer due to the sputtering being overlapped with each other.

Also, the present invention covers a wired circuit board comprising the wired circuit forming board as mentioned above and a conductive pattern formed on the thin metal layer of the wired circuit forming board.

Further, the present invention covers a method for forming a thin metal layer by sputtering a first metal and a second metal on a surface of the insulating layer, wherein the first metal and the second metal are sputtered in such a condition that a first metal diffusing region for the first metal to be diffused on the surface of the insulating layer due to the sputtering and a second metal diffusing region for the second metal to be diffused on the surface of the insulating layer due to the sputtering are overlapped with each other.

According to the wired circuit forming board of the present invention and the wired circuit board of the present invention using the wired circuit forming board, since the thin metal layer comprises at least two different kinds of metals, an improved adhesion between the insulating layer and the conductive pattern can be provided by allowing a metal having a good adhesion with the insulating layer and a different metal having a good adhesion with the conductive pattern to be present in the thin metal layer. Besides, the thin metal layer is formed to contain a metal coexisting portion for allowing the coexistence of the metals of different kinds, to prevent a formation of an interface between the metals of different kinds in the thickness direction of the thin metal layer. This can prevent a generation of delamination in the thin metal layer, and as such can prevent a delamination of the conductive pattern.

Also, the thin metal layer forming method of the present invention can allow a formation of the thin metal layer which comprises the first metal and the second metal and is formed to prevent a formation of the interface between those metals with ease and reliability by simply sputtering the first metal and the second metal in such a condition that the first metal diffusing region and the second metal diffusing region are overlapped with each other.

Figure 1:
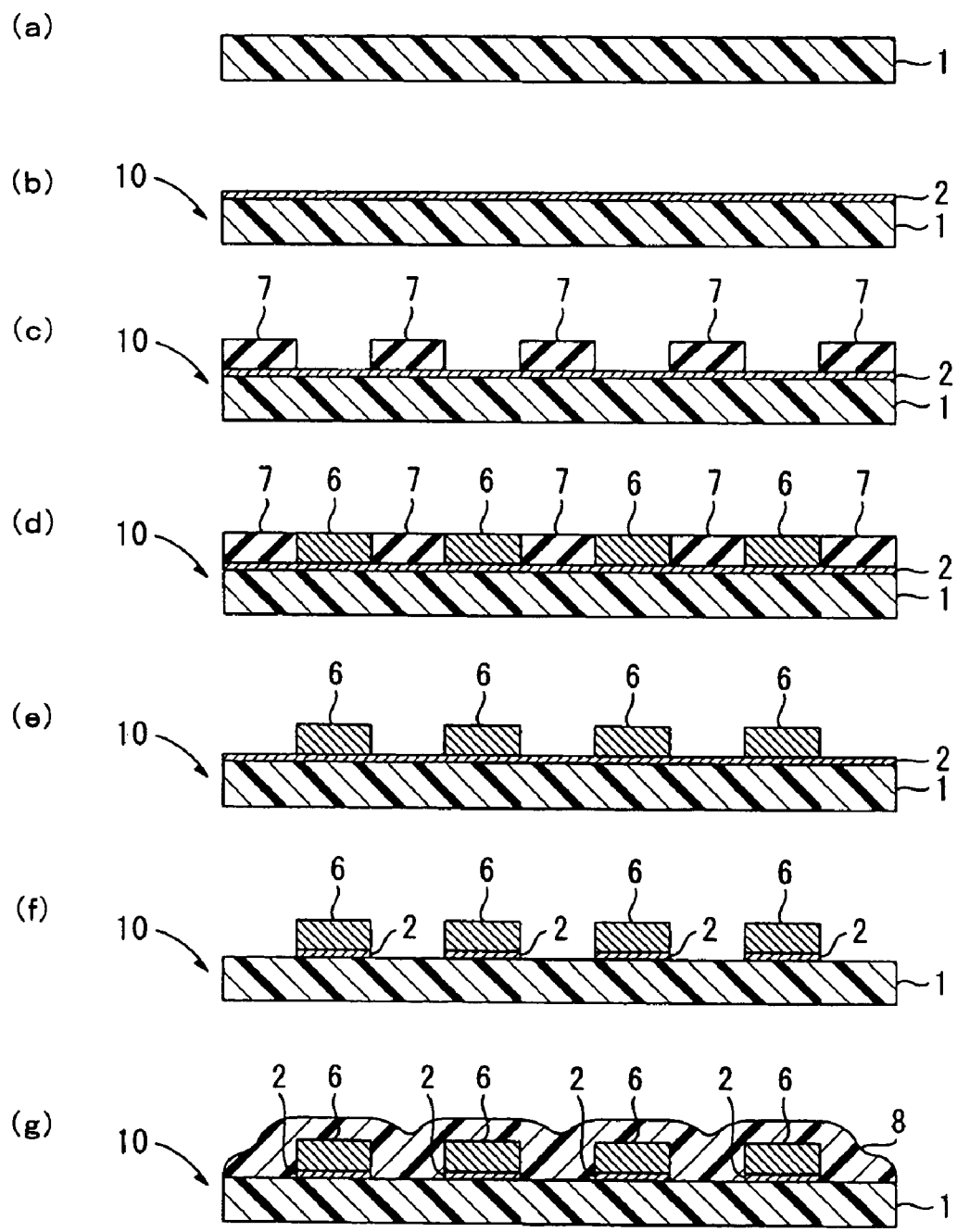
FIG. 1 is a production process drawing showing production processes of a flexible wired circuit board taken as an embodiment of a wired circuit board of the present invention.
Figure 2:
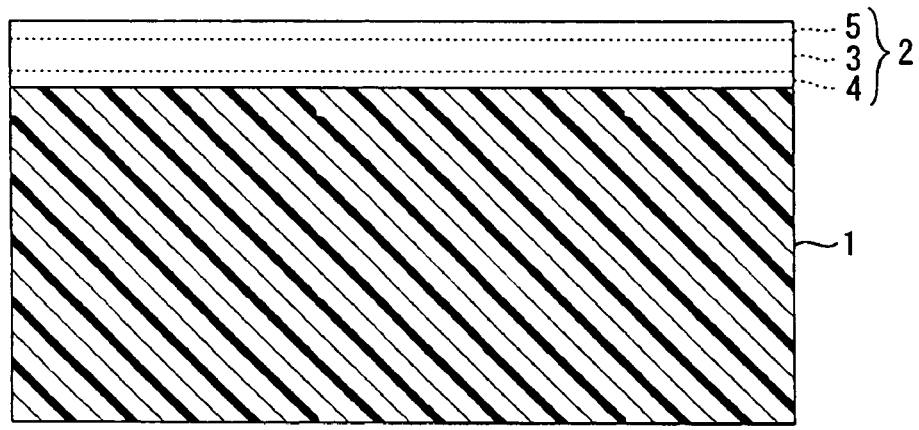
Figure 3:
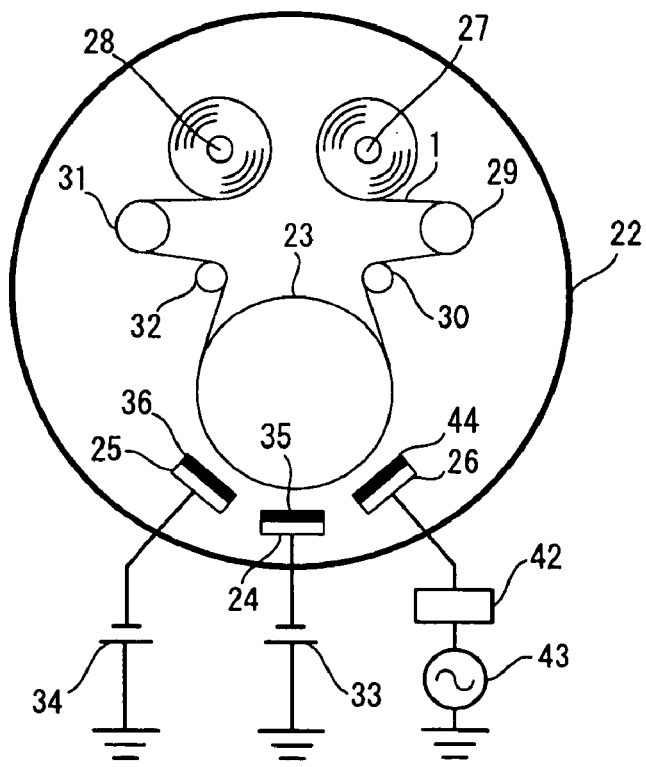
Figure 4:
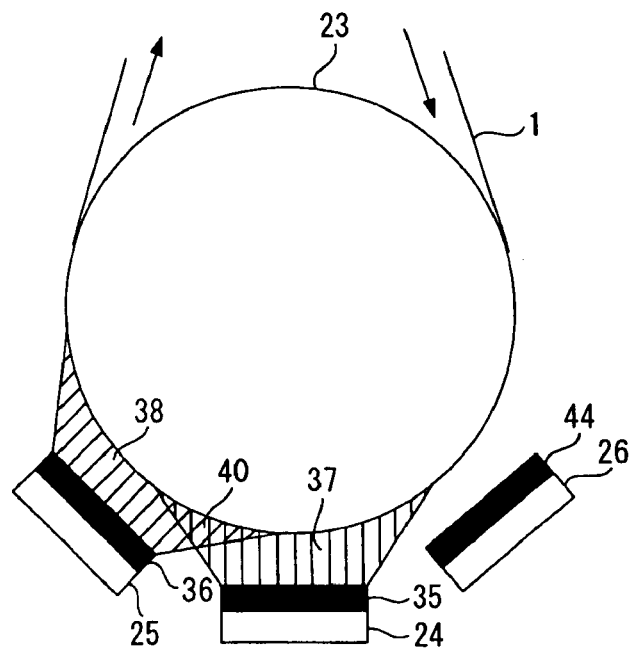
Figure 5:
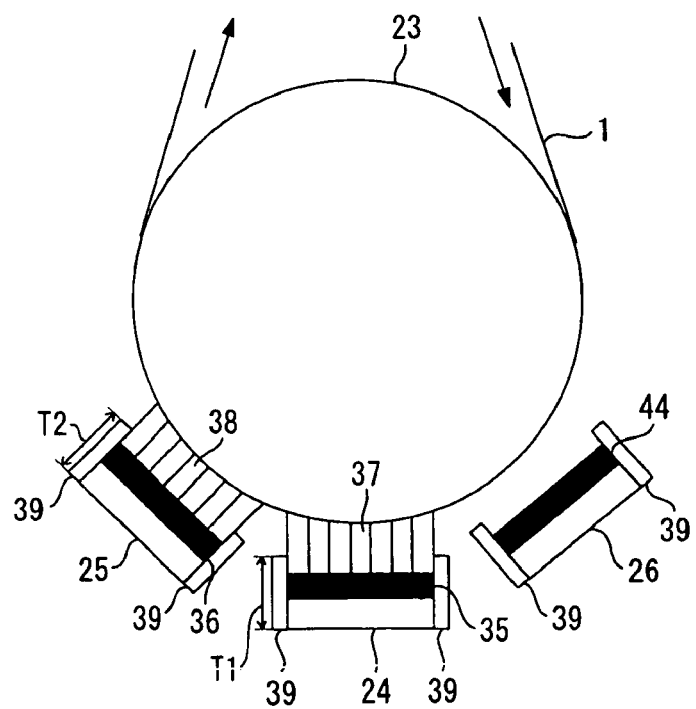
Figure 6:
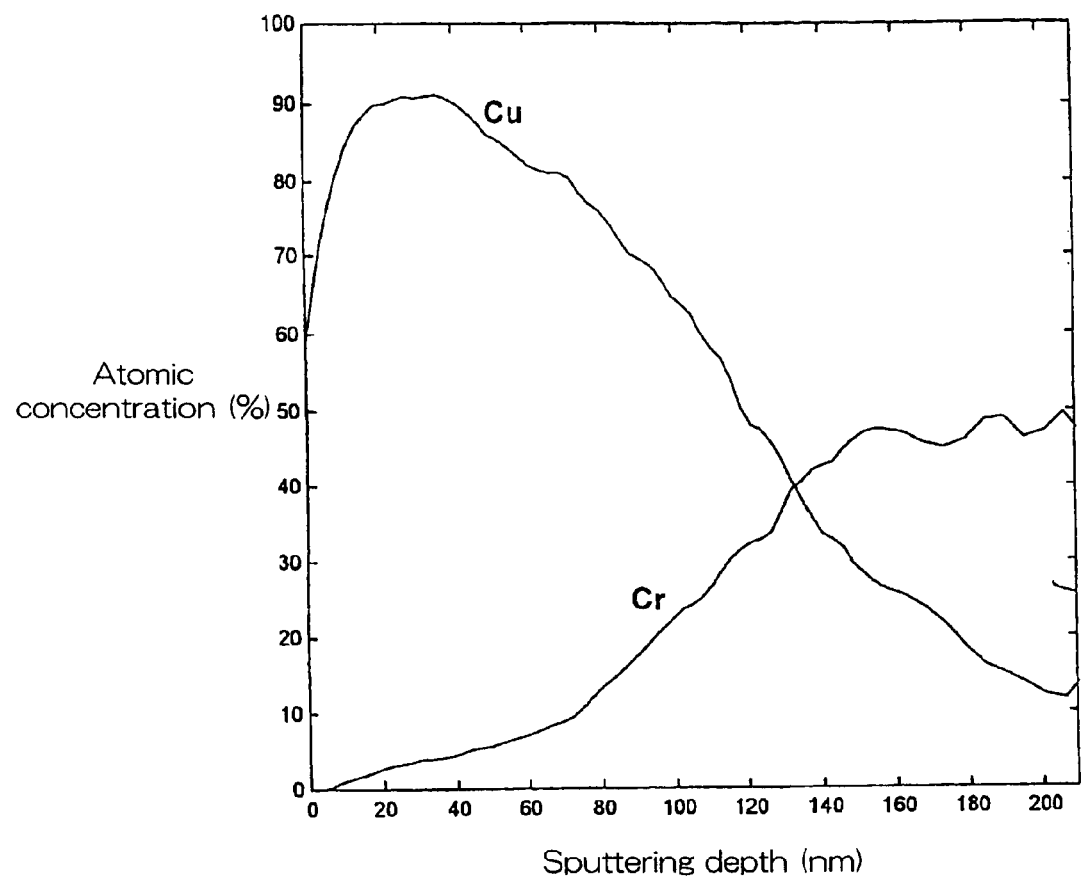

(a) shows the process of preparing an insulating base layer;

(b) shows the process of forming a thin metal layer on the insulating base layer to form a wired circuit forming board;

(c) shows the process of forming on the thin metal layer a plating resist with a reverse pattern to a conductive pattern;

(d) shows the process of forming the conductive pattern in the form of a wired circuit pattern on the thin metal layer exposed from the plating resist;

(e) shows the process of removing the plating resist;

(f) shows the process of removing the thin metal layer exposed from the conductive pattern; and (g) shows the process of forming on the insulating base layer an insulating cover layer to cover the conductive pattern, FIG. 2 is a sectional view of a principal part of a thin metal layer formed in the process of FIG. 1(b), FIG. 3 is a schematic block diagram showing a sputtering device used in the process of FIG. 1(b), FIG. 4 is an illustration of a principal part of the sputtering device shown in FIG. 3 (an aspect of the sputtering device which is not provided with a target cover), FIG. 5 is an illustration of a principal part of the sputtering device shown in FIG. 3 (an aspect of the sputtering device which is provided with a target cover), and FIG. 6 is a graph of the result of an analysis wherein the data of atomic concentration of chromium and copper of Example 6 is plotted against a depth direction of a thin metal layer (sputtering depth).

DETAILED DESCRIPTION OF THE PREFERRED EMBODIMENTS

Referring to FIG. 1, which shows production processes of a flexible wired circuit board taken as an embodiment of a production method of a wired circuit board of the present invention, the production method of this flexible wired circuit board will be explained below.

In this method, an insulating base layer 1 serving as an insulating layer is prepared, first, as shown in FIG. 1(a). The insulating materials that may be used for the insulating base layer 1 include, for example, synthetic resins in film form, such as polyimide resin, polyamide imide resin, acrylic resin, polyether nitrile resin, polyether sulfonic resin, polyethylene terephthalate resin, polyethylene naphthalate resin, polyvinyl chloride resin, and fluorocarbon resin. Preferably, a polyimide resin film is used.

The forms of the insulating base layer 1 include, for example, the one previously produced in film form, and the one produced in such a manner that after liquid solution of photosensitive resin is formed into a film, the resultant film is exposed to light and developed so that it can be formed in a predetermined pattern and then is cured.

The insulating base layer 1 usually has a thickness of e.g. 3-100 µm, or preferably 5-50 µm.

Then, a thin metal layer 2 is formed on the insulating base layer 1, to form a wired circuit forming board 10, as shown in FIG. 1(b). The thin metal layer 2 comprises two different kinds of metals and is formed to prevent formation of an interface between the metals in the thickness direction of the thin metal layer 2 by the presence of a metal coexisting portion 3 where the two kinds of metals are coexistent with each other (Cf. FIG. 2).

To be more specific, the thin metal layer 2 comprises three broadly classified portions, i.e., a first unevenly-distributed metal portion 4 adjacent to the insulating base layer 1, a second unevenly-distributed metal portion 5 adjacent to a conductive pattern 6 mentioned later, and the metal coexisting portion 3 interposed between the first unevenly-distributed metal portion 4 and the second unevenly-distributed metal portion 5. These three portions are continuously present in the thin metal layer without defining any boundaries therebetween.

The first unevenly-distributed metal portion 4 is disposed adjacently on the insulating base layer 1 and is a lower layer portion of the thin metal layer 2 in which a first metal 35 (Cf. FIG. 3) exists in the proportion of not less than 95 atom percent, or preferably not less than 97 atom percent.

No particular limitation is imposed on the metal used for the first metal 35. Any metals having a good adhesion with the insulating base layer 1, such as, for example, nickel, chromium, or chromium alloy, may be used for the first metal 35.

In the first unevenly-distributed metal portion 4, the residual of the first metal 35 is the second metal 36 (Cf. FIG. 3), and the first metal 35 is unevenly distributed so that the proportion of the first metal 35 to the second metal 36 (first metal/second metal) can become decreased gradually from the insulating base layer 1 to the metal coexisting portion 3.

The second unevenly-distributed metal portion 5 is disposed adjacently under the conductive pattern 6 and is an upper layer portion of the thin metal layer 2 in which a second metal 36 exists in the proportion of not less than 95 atom percent, or preferably not less than 97 atom percent.

No particular limitation is imposed on the metal used for the second metal 36. Any metal having a good adhesion with the conductive pattern 6 may be used for the second metal 36. Preferably, copper is used for the second metal 36.

In the second unevenly-distributed metal portion 5, the residual of the second metal 36 is the first metal 35, and the second metal 36 is unevenly distributed so that the proportion of the second metal 36 to the first metal 35 (second metal/first metal) can become increased gradually from the metal coexisting portion 3 to the conductive pattern 6.

The metal coexisting portion 3 is disposed adjacently on the first unevenly-distributed metal portion 4 and also disposed adjacently under the second unevenly-distributed metal portion 5. It is an intermediate layer portion of the thin metal layer 2 in which the first metal 35 and the second metal 36 both exist in the proportion of not less than 5 atom percent, or preferably not less than 10 atom percent, when the total of the first metal 35 and the second metal 36 is 100 atom percent.

The existence ratios of the first metal 35 and the second metal 36 to the thin metal layer 2 with respect to the thickness direction of the thin metal layer 2 can be determined by the analysis using the Auger electron spectroscopy (Auger analysis), for example.

In the metal coexisting portion 3, the first metal 35 and the second metal 36 are coexistent with each other so that the proportion of the first metal 35 to the second metal 36 (first metal/second metal) can become decreased gradually from the first unevenly-distributed metal portion 4 to the second unevenly-distributed metal portion 5.

The thin metal layer 2 has thickness of e.g. 10-500 nm, or preferably 50-300 nm, and it is preferable that the metal coexisting portion 3 exists in the proportion of 50% or more, or preferably 80-100%, of the total dimension of the thin metal layer 2 with respect to the thickness direction thereof. When the proportion of the metal coexisting portion 3 is less than 50%, the thin metal layer 2 may peel easily after the passage of endurance time. It is preferable that the first unevenly-distributed metal portion 4 exists in the proportion of less than 50%, or preferably not more than 20%, of the total dimension of the thin metal layer 2 with respect to the thickness direction thereof, and the second unevenly-distributed metal portion 5 exists in the proportion of less than 50%, or preferably not more than 20%, of the total dimension of the thin metal layer 2 with respect to the thickness direction thereof.

This thin metal layer 2 may be formed by a proper method without any particular limitation. For example, this thin metal layer 2 is formed by using a vacuum evaporation method, or preferably by sputtering using sputtering equipment 21 shown in FIG. 3.

The sputtering equipment 21 shown in FIG. 3 is a magnetron type continuous sputtering equipment comprising a vacuum chamber 22, and an electrode roll 23, a plasma electrode 26, a first sputtering electrode 24, a second sputtering electrode 25, an feed shaft 27, a wind-up shaft 28, two feed-side guide rolls 29, 30, and two wind-up side guide rolls 31, 32, all of which are provided in the vacuum chamber 22.

The plasma electrode 26, the first sputtering electrode 24, and the second sputtering electrode 25 are disposed opposite to the electrode roll 23 at predetermined spaces and are arranged in order at circumferentially spaced locations from an upstream side of a rotation direction of the electrode roll 3 toward a downstream of the same.

The feed shaft 27 and the wind-up shaft 28 are disposed on a side of the electrode roll 23 opposite the plasma electrode 26, the first sputtering electrode 24, and the second sputtering electrode 25.

The two feed-side guide rolls 29, 30 are disposed between the feed shaft 27 and the electrode roll 23, and the two wind-up side guide rolls 31, 32 are disposed between the wind-up shaft 28 and the electrode roll 23.

The insulating base layer 1 in the form of an elongate film is wound around the feed shaft 27. The insulating base layer 1 is fed out from the feed shaft 27 and guided to the electrode roll 23 along the feed-side guide rolls 29, 30. Sequentially, it is moved along an outer circumferential surface of the electrode roll 23 by the rotation of the electrode roll 23 and guided to the wind-up shaft 28 along the wind-up side guide rolls 31, 32 and wound by the wind-up shaft 28.

The first sputtering electrode 24 and the second sputtering electrode 25 are connected with direct-current power sources 33, 34, respectively, and the first metal 35 and the second metal 36, which are used as sputtering targets, are placed on a discharge surface of the first sputtering electrode 24 and a discharge surface of the second sputtering electrode 25, respectively.

As shown in FIG. 4, the first sputtering electrode 24 and the second sputtering electrode 25 are disposed so adjacently that a first metal diffusing region 37 in which the first metal 35 placed on the discharge surface of the first sputtering electrode 24 is diffused on a surface of the insulating base layer 1 by sputtering and a second metal diffusing region 38 in which the second metal 36 placed on the discharge surface of the second sputtering electrode 25 is diffused on a surface of the insulating base layer 1 by sputtering are overlapped with each other.

In contrast, in a conventional sputtering equipment, target covers 39 to surround the sputtering electrode 24 and the second sputtering electrode 25 are arranged to prevent the first metal diffusing region 37 and the second metal diffusing region 38 being overlapped with each other, as shown in FIG. 5. The target covers 39 stand from the circumference of the first sputtering electrode 24 and that of the second sputtering electrode 25, respectively, to extend in a direction in which the first sputtering electrode 24 and the second sputtering electrode 25 are opposed to the electrode roll 23. The respective target covers 39 serve to prevent the first metal 35 diffusing region and the second metal 36 diffusing region being overlapped with each other.

In contrast to this, the sputtering equipment 21 of the present invention is constructed to allow the first metal diffusing region 37 and the second metal diffusing region 38 to be overlapped with each other without the target covers 39 (by removing the target covers 39 from the existing sputtering equipment 21.)

Additionally, the target covers 39 may be provided so that an existence ratio of the metal coexisting portion 3 to the thin metal layer 2 with respect to the thickness direction thereof can be controlled by adjusting heights T1, T2 of the target covers 39 (T1 is a height of the target cover 39 standing from the circumferential of the first sputtering electrode 24, and T2 is a height of the target cover 39 standing from the circumferential of the second sputtering electrode 25) (Cf. Example as will be described later).

To form the thin metal layer 2 continuously by sputtering by using the sputtering equipment 21, an ambient gas is filled in the vacuum chamber 22 to draw a vacuum, first.

Preferably, inert gases, such as, for example, argon, neon, xenon, and krypton may be used as the ambient gas. Industrially, argon is preferably used. Also, the degree of vacuum is set to be e.g. $5 \times 10^{-3}$–1.6 Pa, or preferably $5 \times 10^{-2}$–$1.6 \times 10^{-1}$ Pa.

Then, the insulting base layer 1 wound around the feed shaft 27 is fed out by the feed shaft 27 and guided to the electrode roll 23 along the two feed-side guide rolls 29, 30. Thereafter, it is moved along the outer circumferential surface of the electrode roll 23 by the rotation of the electrode roll 23. Also, voltages are applied from the direct-current electrodes 33, 34 to the first sputtering electrode 24 and the second sputtering electrode 25, respectively, to sputter the first metal 35 and the second metal 36, respectively.

Then, when the insulating base layer 1 enters the first metal diffusing region 37, the first metal 35 diffused due to the sputtering is deposited on the insulating base layer 1 within the first metal diffusing region 37 (except an overlapping region 40 mentioned below). The first unevenly-distributed metal portion 4 is formed on the insulating base layer 1 in the manner mentioned above.

It should be noted that some amount of the second metal 36 may diffuse into even in the first metal diffusing region 37

(except the overlapping region 40 mentioned below). In this case, the first metal 35 is deposited on the surface of the insulating base layer 1 so that the proportion of the first metal 35 to the second metal 36 decreases gradually from the upstream side of the rotation direction of the electrode roll 23 to the downstream of the same. In the case where the second metal 36 is hardly diffused in the first metal diffusing region 37 (except the overlapping region 40 mentioned below), only the first metal 35 is substantially deposited on the insulating base layer 1 in the first metal diffusing region 37 (except the overlapping region 40 mentioned below).

Then, when the insulating base layer 1 enters the overlapping region 40 where the first metal diffusing region 37 and the second metal diffusing region 38 overlap with each other, the first metal 35 and the second metal 36 diffuse due to the sputtering, and are deposited on the insulating base layer 1. This can allow the formation of the metal coexisting portion 3 on the first unevenly-distributed metal portion 4.

It should be noted that the first metal 35 and the second metal 36 are diffused in a mixed state in the overlapping region 40, and the first metal 35 and the second metal 36 are deposited on the surface of the insulating base layer 1 so that the proportion of the first metal 35 to the second metal 36 decreases gradually from the upstream side of the rotation direction of the direction of the electrode roll 23 to the downstream of the same.

Thereafter, the insulating base layer 1 enters the second metal diffusing region 38 (except the overlapping region 40). In the second metal diffusing region 38 (except the overlapping region 40), the second metal 36 diffused due to the sputtering is deposited on the insulating base layer 1. This can allow a formation of the second unevenly-distributed metal portion 5 on the metal coexisting portion 3.

It should be noted that some amount of the first metal 35 may diffuse into the second metal diffusing region 38 (except the overlapping region 40) as well. In this case, the second metal 36 is deposited on the surface of the insulating base layer 1 so that the proportion of the second metal 36 to the first metal 35 increases gradually from the upstream side of the rotation direction of the electrode roll 23 to the downstream of the same. In the case where the first metal 35 is hardly diffused in the second metal diffusing region 38 (except the overlapping region 40), only the second metal 36 is substantially deposited on the insulating base layer 1 in the second metal diffusing region 38 (except the overlapping region 40).

In the sputtering equipment 21, a high-frequency power source 43 is connected to the plasma electrode 26 through a matching circuit 42, and an ingot of metal 44 is placed on the discharge surface of the plasma electrode 26. The plasma electrode 26 is used when the surface of the insulating base layer 1 is subjected to plasma processing to reform the surface of the insulating base layer 1. In the plasma processing, high-frequency voltage is applied from the high-frequency power source 43 to the plasma electrode 26 through the matching circuit 42.

Then, the conductive pattern 6 is formed on the thin metal layer 2 of the wired circuit forming board 10 thus produced. The conductive pattern 6 is formed in the form of a wired circuit pattern by the additive process. First, a plating resist 7 of a pattern reverse to the wired circuit pattern is formed on the surface of the thin metal layer 2, as shown in FIG. 1(c).

No particular limitation is imposed on the process of forming the plating resist 7. For example, the plating resist 7 is formed in the form of a resist pattern reverse to the wired circuit pattern by laminating a dry film photoresist on the entire surface of the thin metal layer 2, then exposing the dry film photoresist to light, and developing it. The plating resist 7 usually has a thickness of 5-30 μm, or preferably 10-20 μm.

Then, the conductive pattern 6 is formed in the form of the wired circuit pattern on the surface of the thin metal layer 2 exposed from the plating resist 7, as shown in FIG. 1(d).

The conductive materials that may be used for the conductive pattern 6 include, for example, copper, nickel, gold, solder, or alloys thereof. Copper is preferably used. Also, the conductive pattern 6 is formed by plating such as electroless plating and electrolytic plating. Preferably, the electrolytic plating is used. To be more specific, the conductive pattern 6, which is formed of copper, is formed by electrolytic copper plating in the form of the wired circuit pattern on an area of the thin metal layer 2 where the plating resist 7 is not formed. Plating solutions that may be used for the electrolytic copper plating include, for example, plating solution of copper sulfate, and plating solution of copper pyrophosphate.

The conductive pattern 6 usually has thickness of 3-20 μm, or preferably 5-15 μm.

Then, the plating resist 7 is removed, as shown in FIG. 1(e). A known etching process, such as a chemical etching (wet etching) using alkaline solution such as solution of sodium hydroxide as the etching solution, or stripping is used for the removal of the plating resist 7.

Then, the thin metal layer 2 exposed from the conductive pattern 6 is removed, as shown in FIG. 1(f). A known etching process, such as a chemical etching (wet etching) using solution of ferric chloride, solution of potassium ferrocyanide, or the like as the etching solution, is used for the removal of the thin metal layer 2.

Additionally, a metal plating layer, such as a nickel plating layer and a gold plating layer, may be formed on the surface of the conductive pattern 6 thus formed by a plating process, such as the electrolytic plating or the electroless plating.

Thereafter, an insulating cover layer 8 may be formed on the insulating base layer 1, to cover the conductive pattern 6, if necessary, as shown in FIG. 1(g). The flexible wired circuit board is produced in the manner as mentioned above.

The same synthetic resin used for the insulating base layer 1 may be used for the insulating cover layer 8. Preferably, polyimide resin is used for the insulating cover layer. The insulating cover layer 8 can be formed, for example, by coating solution of photosensitive resin over the insulating base layer 1 including the conductive pattern 6, then exposing the coat to light and developing it to be formed in a predetermined pattern, and then curing it.

The insulating cover layer 8 usually has a thickness of 2-50 μm, or preferably 5-30 μm.

According to the flexible wired circuit board thus produced using the wired circuit forming board 10 mentioned above, the thin metal layer 2 comprises three broadly classified portions, i.e., the first unevenly-distributed metal portion 4 adjacent to the insulating base layer 1, the second unevenly-distributed metal portion 5 adjacent to the conductive pattern 6, and the metal coexisting portion 3 interposed between the first unevenly-distributed metal portion 4 and the second unevenly-distributed metal portion 5, and these three portions are continuously present in the thin metal layer 2 without defining any boundaries therebetween. This construction can provide an improved adhesion between the insulating base layer 1 and the conductive pattern 6 by using nickel, chromium, or chromium alloy having a good adhesion with the insulating base layer 1 as the first metal 35 unevenly distributed in the first unevenly-distributed metal portion 4, and using copper having a good adhesion with the conductive pattern 6 as the second metal 36 unevenly distributed in the second unevenly-distributed metal portion 5. In addition, since the first unevenly-distributed metal portion 4, the second unevenly-distributed metal portion 5 and the metal coexisting portion 3 are continuously present in the thin metal layer 2 without defining any boundaries therebetween, generation of delamination between the first metal 35 and the second metal 36 in the thin metal layer 2 can be prevented, and as such can prevent the delamination of the conductive pattern 6.

Also, the method for forming the thin metal layer 2 can allow formation of the thin metal layer 2 wherein the first unevenly-distributed metal portion 4, the second unevenly-distributed metal portion 5 and the metal coexisting portion 3 are continuously present in the thin metal layer 2 without defining any boundaries therebetween with ease and reliability by simply sputtering the first metal 35 and the second metal 36 in such a condition that the first metal diffusing region 37 and the second metal diffusing region 38 are overlapped with each other using the sputtering equipment 21.

EXAMPLES

While in the following, the present invention will be described in further detail with reference to Examples, the present invention is not limited to any of the examples.

Example 1

In a sputtering equipment shown in FIG. 3 (which is not equipped with the target covers to be fitted with the first sputtering electrode and the second sputtering electrode), the insulating base layer of a polyimide resin film of 25 μm thick was wound around the feed shaft (Cf. FIG. 1(a)). Then, chromium forming the first metal was placed on a discharge side of the first sputtering electrode, and copper forming the second metal was placed on a discharge side of the second sputtering electrode. Thereafter, argon was filled in the vacuum chamber, so that the degree of vacuum in the vacuum chamber was set at $1 \times 10^{-1}$ Pa. Thereafter, the insulating base layer was fed out by the feed shaft and was moved along the outer circumferential surface of the electrode roll by the rotation of the electrode roll. In parallel with this, voltages were applied to the first sputtering electrode and the second sputtering electrode from their respective direct-current power sources, whereby the chromium and the copper were sputtered on the insulating base layer moving along the outer circumferential surface of the electrode roll.

The thin metal layer in which the first unevenly-distributed metal portion, the metal coexisting portion, and the second unevenly-distributed metal portion were present continuously without defining any boundaries therebetween was formed on the insulating base layer, to thereby produce the wired circuit forming board (Cf FIG. 1(b)). The existence ratios among the first unevenly-distributed metal portion, the metal coexisting portion, and the second unevenly-distributed metal portion with respect to the thickness dimension of the thin metal layer (obtained by the Auger analysis) are shown in TABLE 1.

Then, after the dry film photoresist was laminated on the entire surface of the thin metal layer, it was exposed to light and developed, whereby the plating resist having thickness of 15 μm was formed in the form of the resist pattern reverse to the wired circuit pattern (Cf. FIG. 1(c)).

Thereafter, the conductive pattern having thickness of 10 μm was formed in the wired circuit pattern on the surface of the thin metal layer exposed from the plating resist by electrolytic copper plating using plating solution of copper sulfate (Cf. FIG. 1(d)).

Then, the plating resist was removed by chemical etching using solution of sodium hydroxide (Cf. FIG. 1(e)). Then, the thin metal layer exposed from the conductive pattern was removed by chemical etching using solution of ferric chloride (Cf. FIG. 1(f)). The flexible wired circuit board was produced in the manner mentioned above.

Examples 2 to 8

Except that the sputtering equipment shown in FIG. 3 was equipped with the target covers for the first sputtering electrode and the second sputtering electrode having heights shown in TABLE 1 (where T1 is a height of the target cover 39 of the first sputtering electrode, and T2 is a height of the target cover 39 of the second sputtering electrode), the same operations were carried out in the same manner as in Example 1, to obtain the flexible wired circuit boards.

The result of analysis of the data of atomic concentration of chromium and copper of Example 2 is plotted against a depth direction of the thin metal layer (sputtering depth) is shown in FIG. 6.

Evaluation (Delamination of the Conductive Pattern)

A nickel plating layer and a gold plating layer were formed on the conductive pattern of each of the Examples by electrolytic nickel plating and electrolytic gold plating, respectively. Then, after those samples were allowed to stand for 168 hours, 240 hours, 360 hours, and 480 hours in an atmosphere of relative humidity of 60% and temperature of 90° C., cellophane tapes were adhered to a surface of the conductive pattern (gold plating layer) and then peeled off, to evaluate the presence of the delamination of the conductive pattern. The delamination time that elapses before delaminartion is shown in TABLE 1.

TABLE 1

| | Height of Target Cover (mm) | | Thickness of Thin Metal Layer | Existence Ratio in Thickness Direction of Thin Metal Layer (%) | | | Delamination time (h) |
|---|---|---|---|---|---|---|---|
| | T1 | T2 | | 1st unevenly-distributed metal portion | 2nd unevenly-distributed metal portion | Metal coexisting portion | |
| Ex. 1 | 0 | 0 | 200 | 0 | 0 | 100 | 480< * |
| Ex. 2 | 15 | 0 | 200 | 0 | 10 | 90 | 480< * |
| Ex. 3 | 15 | 15 | 200 | 10 | 10 | 80 | 480< * |
| Ex. 4 | 20 | 20 | 200 | 15 | 20 | 65 | 480 |
| Ex. 5 | 30 | 30 | 200 | 20 | 30 | 50 | 480 |
| Ex. 6 | 35 | 35 | 200 | 20 | 50 | 30 | 360 |

TABLE 1-continued

|  | Height of Target Cover (mm) | | Thickness of Thin Metal Layer | Existence Ratio in Thickness Direction of Thin Metal Layer (%) | | | Delamination time (h) |
|---|---|---|---|---|---|---|---|
|  | T1 | T2 |  | 1st unevenly-distributed metal portion | 2nd unevenly-distributed metal portion | Metal coexisting portion |  |
| Ex. 7 | 45 | 45 | 200 | 25 | 65 | 10 | 240 |
| Ex. 8 | 60 | 60 | 200 | 25 | 70 | 5 | 240 |

* No delamination was found after passage of 480 hours

While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A wired circuit forming board comprising:
an insulating layer, and a thin metal layer formed on the insulating layer;
wherein the thin metal layer comprises a first metal and a second metal of different kinds and is formed to prevent formation of an interface between the first metal and the second metal in a thickness direction of the thin metal layer by a presence of a metal coexisting portion where the first metal and the second metal are coexistent with each other;
wherein the metal coexisting portion exists in a thickness direction of the thin metal layer in a proportion of 50% or more; and
wherein the thin metal layer has a high existence ratio of the first metal and the second metal on one thickness-wise side thereof adjacent to the insulating layer and a high existence ration of the second metal to the first metal on the other thickness-wise side thereof not adjacent to the insulating layer, and wherein the metal coexisting portion exists at least partway along the thickness direction of the thin metal layer.

2. The wired circuit forming board according to claim 1, wherein the second metal is copper.

3. The wired circuit forming board according to claim 1, wherein the first metal is chromium or alloy thereof.

4. The wired circuit forming board according to claim 1, wherein the thin metal layer is formed by sputtering the first metal and the second metal sequentially on a surface of the insulating layer, and the metal coexisting portion is formed by a first metal diffusing region for the first metal to be diffused on the surface of the insulating layer due to the sputtering and a second metal diffusing region for the second metal to be diffused on the surface of the insulating layer due to the sputtering being overlapped with each other.

5. The wired circuit forming board according to claim 1, wherein the thin metal layer contains chromium and copper, and comprises a chromium layer, the metal coexisting portion formed on the chromium layer, and a copper layer formed on the metal coexisting portion,
wherein the metal coexisting portion has a high existence ratio of chromium to copper on the chromium layer side and a high existence ratio of copper to chromium on the copper layer side thereof, and
wherein the metal coexisting portion exists in the thickness direction of the thin metal layer in a proportion of 80% or more.

6. A wired circuit board comprising:
a wired circuit forming board which comprises an insulating layer and a thin metal layer formed on the insulating layer,
a conductive pattern formed on the thin metal layer of the wired circuit forming board;
wherein the thin metal layer comprises a first metal and a second metal of different kinds and is formed to prevent formation of an interface between the first metal and the second metal in a thickness direction of the thin metal layer by a presence of a metal coexisting portion where the first metal and the second metal are coexistent with each other;
wherein the metal coexisting portion exists in a thickness direction of the thin metal layer in a proportion of 50% or more; and
wherein the thin metal layer has a high existence ratio of the first metal and the second metal on one thickness-wise side thereof adjacent to the insulating layer and a high existence ration of the second metal to the first metal on the other thickness-wise side thereof not adjacent to the insulating layer, and wherein the metal coexisting portion exists at least partway along the thickness direction of the thin metal layer.

* * * * *